US006931614B2

United States Patent
Jung et al.

(10) Patent No.: US 6,931,614 B2
(45) Date of Patent: Aug. 16, 2005

(54) METHOD AND APPARATUS FOR PLACING REPEATING FLIP-FLOP STATIONS ON SIGNAL LINES WITHIN AN INTEGRATED CIRCUIT

(75) Inventors: Dae Suk Jung, Santa Clara, CA (US); Jiun-Cheng Hsu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 211 days.

(21) Appl. No.: 10/427,177

(22) Filed: Apr. 30, 2003

(65) Prior Publication Data

US 2004/0233732 A1 Nov. 25, 2004

(51) Int. Cl.[7] .............................................. G06F 17/50
(52) U.S. Cl. ............................ 716/10; 716/9; 716/11
(58) Field of Search ...................................... 716/4–12

(56) References Cited

U.S. PATENT DOCUMENTS

| | | | | |
|---|---|---|---|---|
| 5,397,749 A | * | 3/1995 | Igarashi | 716/8 |
| 6,209,121 B1 | * | 3/2001 | Goto | 716/6 |
| 6,725,438 B2 | * | 4/2004 | van Ginneken | 716/10 |
| 6,763,506 B1 | * | 7/2004 | Betz et al. | 716/6 |
| 2004/0153984 A1 | * | 8/2004 | Akkiraju | 716/6 |

* cited by examiner

Primary Examiner—Vuthe Siek
Assistant Examiner—Binh Tat
(74) Attorney, Agent, or Firm—Park, Vaughan & Fleming LLP; Edward J. Grundler

(57) ABSTRACT

A system is provided that facilitates placing repeating flip-flop stations on signal lines within an integrated circuit. The system operates by first receiving a layout that includes multiple functional blocks, and a netlist that specifies interconnections for signals between these functional blocks. The system determines a transit time for a signal interconnecting the functional blocks. If this transit time exceeds an allowed time, the system divides the interconnection into two or more sections, wherein the transit times on the sections are each less than the allowed time. The system then places a repeating flip-flop station within a channel on the integrated circuit in a position that allows the transit time on these sections to be met. Next, the system routes the signal from the originating functional block through a flip-flop located at the repeating flip-flop station to a receiver at the destination functional block.

18 Claims, 4 Drawing Sheets

METHOD AND APPARATUS FOR PLACING REPEATING FLIP-FLOP STATIONS ON SIGNAL LINES WITHIN AN INTEGRATED CIRCUIT

BACKGROUND

1. Field of the Invention

The present invention relates to the design of integrated circuits. More specifically, the present invention relates to a method and an apparatus for placing repeating flip-flop stations on signal lines within an integrated circuit.

2. Related Art

Modern integrated circuits include many functional blocks such as arithmetic-logic units, cache memory units, I/O units, and the like. After these functional blocks have been placed on the floor plan of the integrated circuit, the functional blocks are interconnected through signal lines to allow signals to flow between the functional blocks.

During this interconnection process, the signal paths must be kept short so that the transit time for a signal does not exceed one clock cycle. On signal paths that are longer than one clock cycle, one or more flip-flops need to be placed in the signal path to divide the signal path into multiple segments, wherein each segment takes less than one clock cycle to traverse.

FIG. 1 illustrates the process of segmenting a signal path on an integrated circuit 102. Integrated circuit 102 includes functional blocks 104, 106, 108, 110, and 112. Integrated circuit 102 also includes repeater stations 114, 116, 118, 120, 122, 124, 126, and 128, which can be used to provide fan-out for signals between functional blocks 104, 106, 108, 110, and 112 and for other purposes. Note that repeater stations 114, 116, 118, 120, 122, 124, 126, and 128 are located in channels 130.

As illustrated by the dashed line in FIG. 1, a signal source 111 in functional block 112 is interconnected with a signal receiver 107 in functional block 106. Because this signal path is greater than one clock cycle, the signal path is split into segments 132 and 134, which each have a delay less than one clock cycle. Flip-flop 133 is used to couple segment 132 to segment 134. However, since flip-flop 133 is placed within functional block 104 the register transfer language (RTL) source for functional block 104 must be changed. This is undesirable because within functional block 104 many elements can be affected, which can require adjustments to timing and placement of critical elements. Additionally, since integrated circuit clock speeds are continuing to increase and integrated circuit sizes are continuing to increase, it is becoming increasingly more difficult to place the repeating flip-flops into functional blocks while still providing segments with less than one cycle delay.

Hence, what is needed is a method and an apparatus that allows flip-flops to be placed on signal paths without the problems described above.

SUMMARY

One embodiment of the present invention provides a system that facilitates placing repeating flip-flop stations on signal lines within an integrated circuit. The system operates by first receiving a layout and a netlist for the integrated circuit, wherein the layout includes multiple functional blocks and the netlist specifies interconnections for signals between these functional blocks. Next, the system determines a transit time for a signal interconnecting a first functional block and a second functional block within the multiple functional blocks. If the transit time exceeds an allowed time, the system divides the interconnection into a first section and a second section, wherein the transit times on the first section and on the second section are less than the allowed time. The system then places a repeating flip-flop station within a channel on the integrated circuit in a position that allows the transit time on the first section and the second section to be met. Next, the system routes the first section from the first functional block to an input of a flip-flop located at the repeating flip-flop station, and also routes the second section from an output of the flip-flop to the second functional block.

In a variation of this embodiment, routing the first section and the second section through the repeating flip-flop station allows signal timing requirements to be met without changing circuitry within any functional blocks in the integrated circuit.

In a further variation, the repeating flip-flop station includes a plurality of flip-flops.

In a further variation, the system places the repeating flip-flop station at a location where flip-flops within the repeating flip-flop station can provide timing correction for multiple signals.

In a further variation, the layout includes a third functional block within the plurality of functional blocks, wherein the third functional block includes an embedded channel.

In a further variation, the repeating flip-flop station is overlaid on the embedded channel.

In a further variation, placing multiple repeating flip-flop stations within channels on the integrated circuit divides the interconnection into more than two segments to meet timing requirements.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Segmenting a Signal Path

Figure 1:
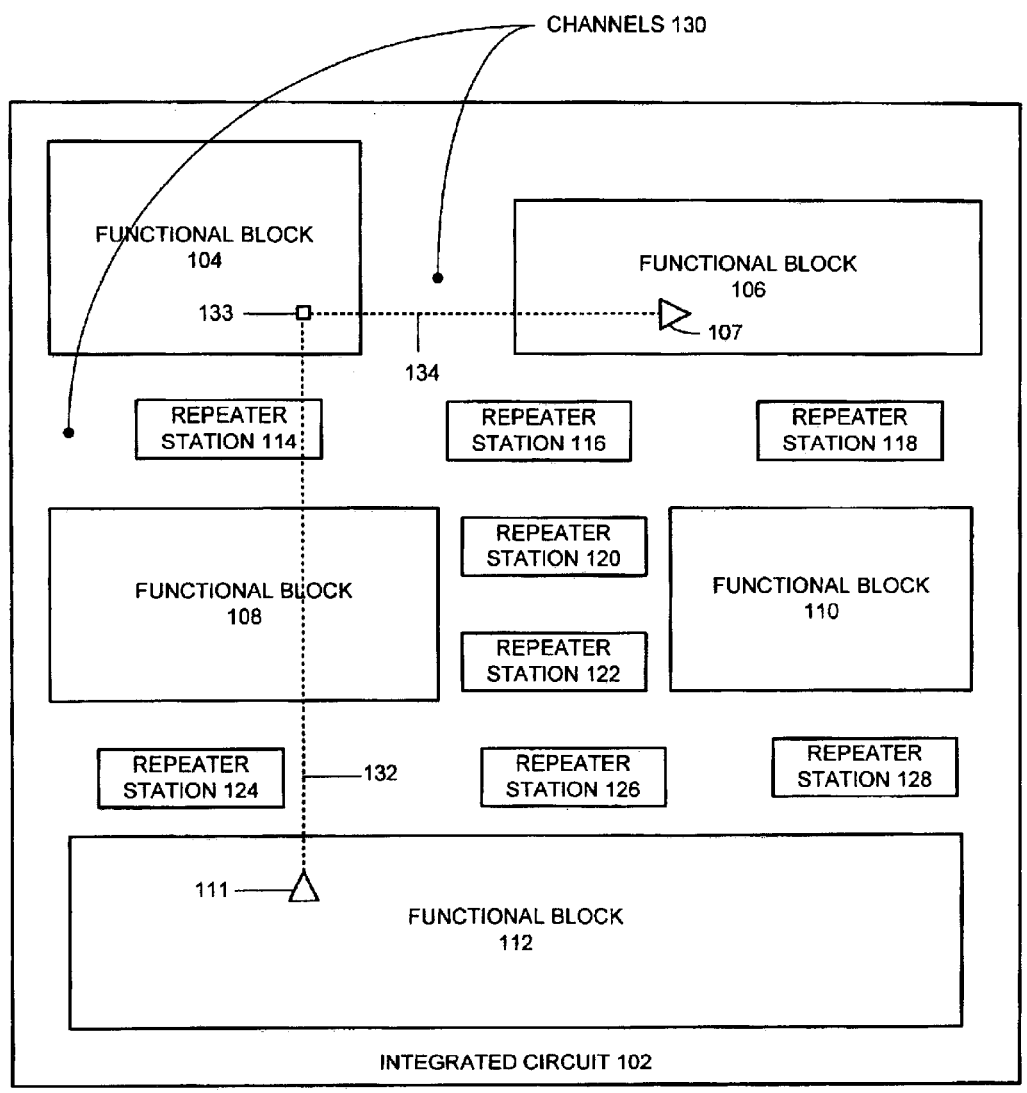
FIG. 1 illustrates the process of segmenting a signal path on an integrated circuit.
Figure 2:
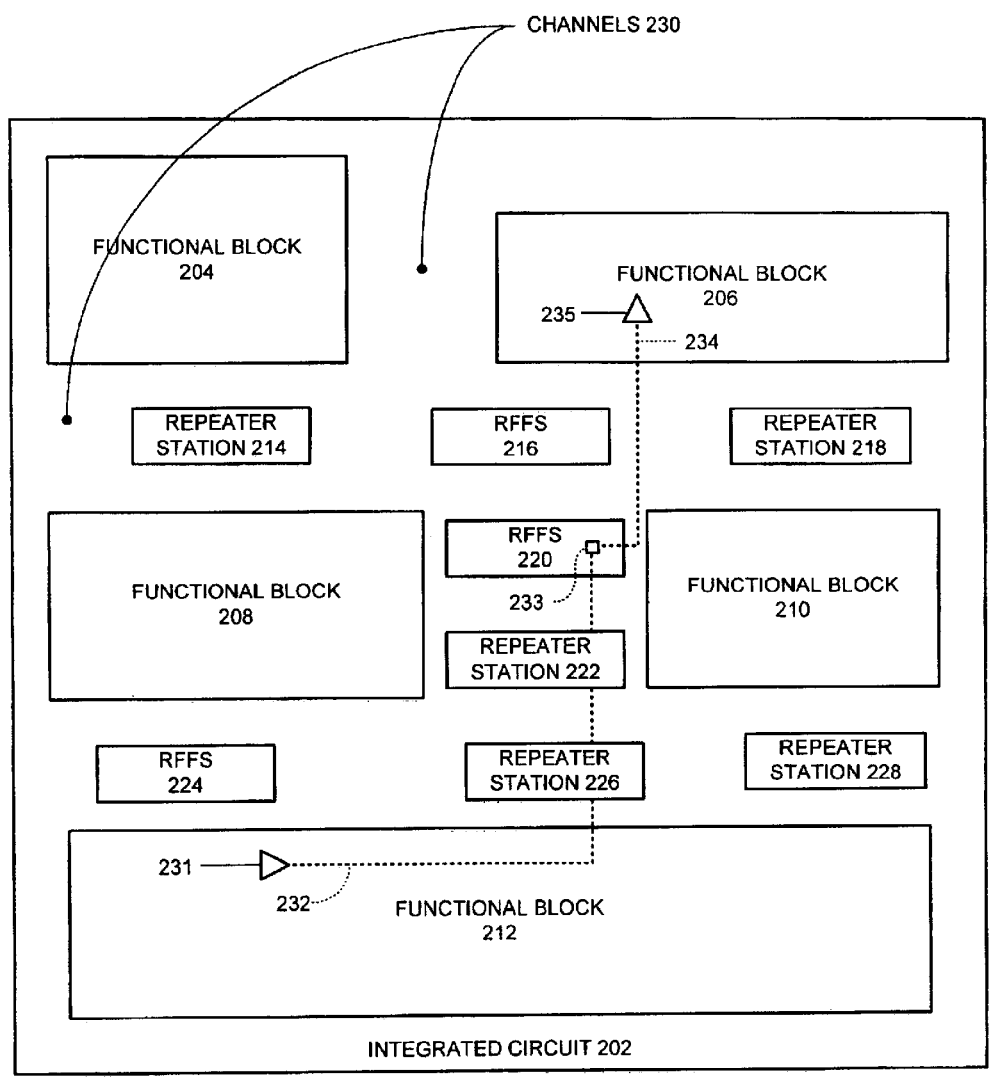
FIG. 2 illustrates the process of segmenting a signal path on an integrated circuit in accordance with an embodiment of the present invention.

FIG. 2 illustrates the process of segmenting a signal path on an integrated circuit 202 in accordance with an embodiment of the present invention. Integrated circuit 202 includes functional blocks 204, 206, 208, 210, and 212. Functional blocks 204, 206, 208, 210, and 212 provide the basic functional units of integrated circuit 202 such as arithmetic-logic units, cache memory units, I/O units, and the like. Integrated circuit 202 also includes repeater stations 214, 218, 222, 226, and 228, which provide repeaters that can be used to provide fan-out for signals between functional blocks 204, 206, 208, 210, and 212, and for other purposes. Integrated circuit 202 also includes repeating flip-flop stations (RFFS) 216, 220, and 224, which are placed to provide proper timing for multiple signals routed through RFFS 216, 220, and 224. Note that repeater stations 214, 218, 222, 226, and 228, and RFFS 216, 220, and 224 are located in channels 230.

As illustrated in FIG. 2, a signal source 231 in functional block 212 is interconnected with a signal receiver 235 in functional block 206. Since the signal path is greater than one clock cycle, the signal path is split into segments 232 and 234, which each have a delay less than one clock cycle. Flip-flop 233 within RFFS 220 is used to couple segment 232 to segment 234. Placing flip-flop 233 within RFFS 220 obviates the need to change the register transfer language (RTL) source for any functional block. RFFS 220 is placed within channel 230 and typically replaces a repeater station that would otherwise be located at the same position within channel 230. Each RFFS is placed within channel 230 at a position that provides proper timing for the maximum number of signals that need to be segmented as described below.

Embedded Channels

Figure 3:
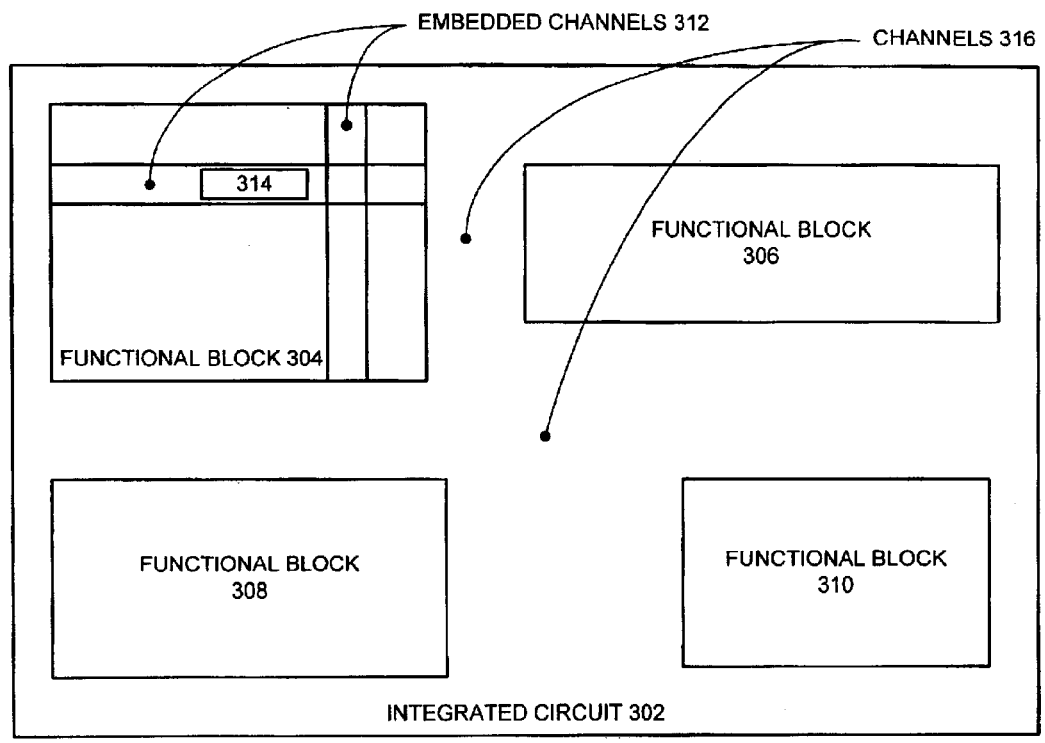
FIG. 3 illustrates embedded channels within a functional block in accordance with an embodiment of the present invention.

FIG. 3 illustrates embedded channels 312 within a functional block 304 in accordance with an embodiment of the present invention. As is illustrated in FIG. 3, integrated circuit 302 includes functional blocks 304, 306, 308, and 310. Note that integrated circuit 302 is similar to integrated circuit 202 in FIG. 2 and can include repeater stations and repeating flip-flop stations in channels 316. Functional block 304 includes embedded channels 312, which can be used for placing repeaters or repeating flip-flop stations, such as overlay 314. Note that placing repeaters or repeating flip-flop stations in embedded channels 312 does not change other circuitry within functional block 304.

Repeating Flip-Flop Station

Figure 4:
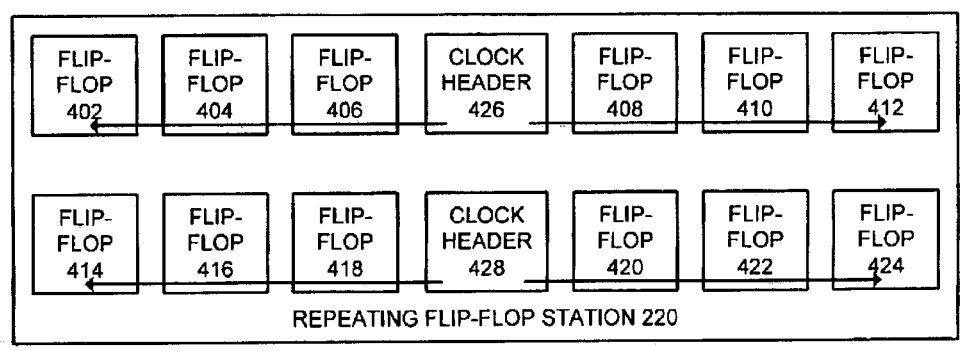
FIG. 4 illustrates a repeating flip-flop station in accordance with an embodiment of the present invention.

FIG. 4 illustrates the structure of a repeating flip-flop station 220 in accordance with an embodiment of the present invention. Repeating flip-flop station 220 includes flip-flops 402, 404, 406, 408, 410, 412, 414, 416, 418, 420, 422, and 424, and clock headers 426 and 428. Note that repeating flip-flop station 220 can include more or fewer flip-flops and clock headers than are shown in FIG. 4. Clock headers 426 and 428 provide clock distribution to flip-flops 402, 404, 406, 408, 410, 412, 414, 416, 418, 420, 422, and 424. Each of flip-flops 402, 404, 406, 408, 410, 412, 414, 416, 418, 420, 422, and 424 can be used as a repeating flip-flop for a signal between functional blocks of an integrated circuit.

Process of Placing Repeating Flip-Flop Stations

Figure 5:
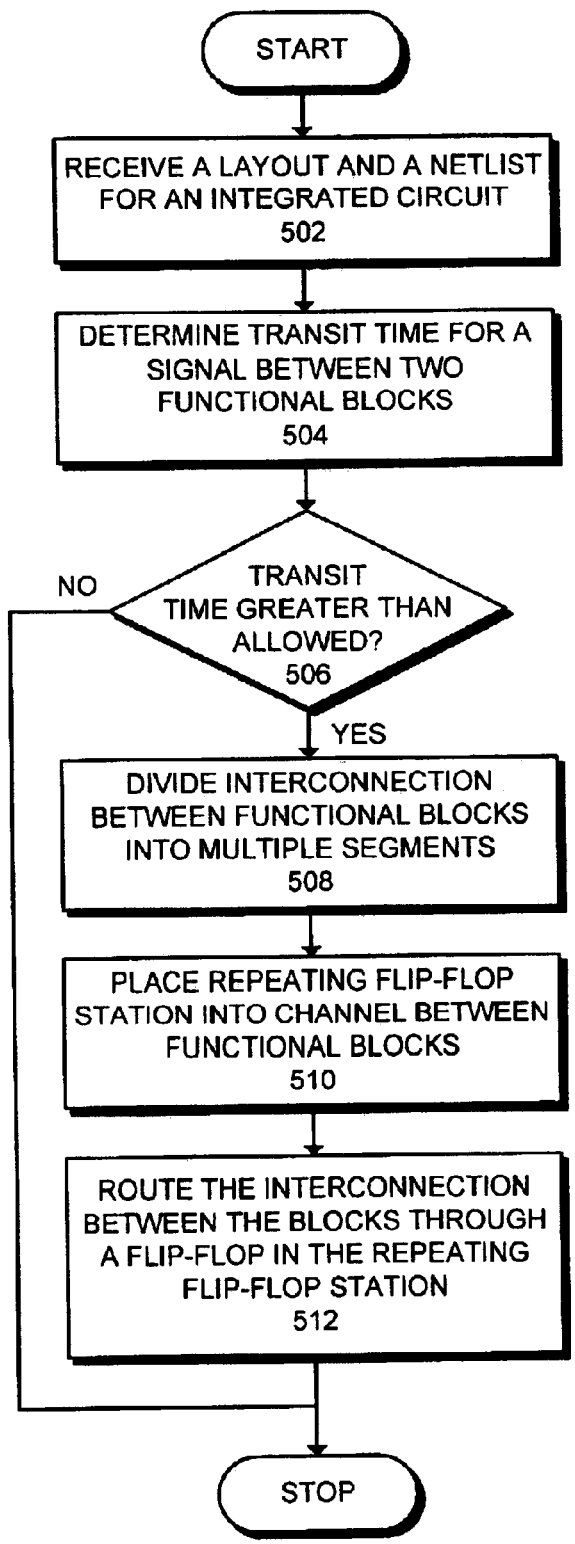
FIG. 5 presents a flowchart illustrating the process of placing a repeating flip-flop station and routing an interconnection through a repeating flip-flop station in accordance with an embodiment of the present invention.

FIG. 5 presents a flowchart illustrating the process of placing a repeating flip-flop station and routing an interconnection through a flip-flop within the repeating flip-flop station in accordance with an embodiment of the present invention. The system starts when a layout and a netlist for an integrated circuit are received (step 502). Next, the system determines the transit time for a signal between two functional blocks (step 504). The system then determines if the transit time is greater than an allowed transit time, typically one clock cycle (step 506). If not, the process is terminated.

If the transit time is greater than an allowed transit time, the system divides the interconnection between functional blocks into multiple segments (step 508). Next, the system places a repeating flip-flop station into a channel between functional blocks (step 510). This repeating flip-flop station is placed using timing parameters from segments of this interconnection plus other interconnections that may be routed through this repeating flip-flop station. Finally, the system routes the interconnection segments between the functional blocks by using a flip-flop within the repeating flip-flop station (step 512).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for placing repeating flip-flop stations on integrated circuit, comprising:

receiving a layout and a netlist for the integrated circuit, wherein the layout includes a plurality of functional blocks and the netlist includes interconnection data for the plurality of functional blocks;

determining a transit time for a signal on an interconnection between a first functional block and a second functional block within the plurality of functional blocks; and if the transit time exceeds an allowed time, dividing the interconnection into a first section and a second section, wherein transit times on the first section and on the second section are less than the allowed time, placing a repeating flip-flop station within an embedded channel within the functional block on the integrated circuit, wherein the repeating flip-flop station is placed in a position that allows the transit time on the first section and the second section to be met and wherein routing the first section and the second section through the repeating flip-flop station allows signal timing requirements to be met without changing circuitry within a functional block of the plurality of functional blocks, routing the first section from the first functional block to an input of a flip-flop located at the repeating flip-flop station, and routing the second section from an output of the flip-flop to the second functional block.

2. The method of claim 1, wherein the repeating flip-flop station includes a plurality of flip-flops.

3. The method of claim 2, further comprising placing the repeating flip-flop station at a location where flip-flops within the repeating flip-flop station can provide timing correction for multiple signals.

4. The method of claim 1, wherein the layout includes a third functional block within the plurality of functional blocks, wherein the third functional block includes an embedded channel.

5. The method of claim 4, wherein the repeating flip-flop station is overlaid on the embedded channel.

6. The method of claim 1, further comprising placing multiple repeating flip-flop stations within channels on the integrated circuit thereby providing an ability to divide the interconnection into more than two segments to meet timing requirements.

7. A computer-readable storage medium storing instructions that when executed by a computer cause the computer to perform a method for placing repeating flip-flop stations on an integrated circuit, the method comprising:

receiving a layout and a netlist for the integrated circuit, wherein the layout includes a plurality of functional blocks and the netlist includes interconnection data for the plurality of functional blocks;

determining a transit time for a signal on an interconnection between a first functional block and a second functional block within the plurality of functional blocks; and if the transit time exceeds an allowed time, dividing the interconnection into a first section and a second section, wherein transit times on the first section and on the second section are less than the allowed time, placing a repeating flip-flop station within an embedded channel within the functional block on the integrated circuit, wherein the repeating flip-flop station is placed in a position that allows the transit time on the first section and the second section to be met and wherein routing the first section and the second section through the repeating flip-flop station allows signal timing requirements to be met without changing circuitry within a functional block of the plurality of functional blocks, routing the first section from the first functional block to an input of a flip-flop located at the repeating flip-flop station, and routing the second section from an output of the flip-flop to the second functional block.

8. The computer-readable storage medium of claim 7, wherein the repeating flip-flop station includes a plurality of flip-flops.

9. The computer-readable storage medium of claim 8, the method further comprising placing the repeating flip-flop station at a location where flip-flops within the repeating flip-flop station can provide timing correction for multiple signals.

10. The computer-readable storage medium of claim 7, wherein the layout includes a third functional block within the plurality of functional blocks, wherein the third functional block includes an embedded channel.

11. The computer-readable storage medium of claim 10, wherein the repeating flip-flop station is overlaid on the embedded channel.

12. The computer-readable storage medium of claim 7, the method further comprising placing multiple repeating flip-flop stations within channels on the integrated circuit thereby providing an ability to divide the interconnection into more than two segments to meet timing requirements.

13. An apparatus for placing repeating flip-flop stations on integrated circuit, comprising:

a receiving mechanism configured to receive a layout and a netlist for the integrated circuit, wherein the layout includes a plurality of functional blocks and the netlist includes interconnection data for the plurality of functional blocks;

a determining mechanism configured to determine a transit time for a signal on an interconnection between a first functional block and a second functional block within the plurality of functional blocks;

a dividing mechanism configured to divide the interconnection into a first section and second section, wherein transit times on the first section and on the second section are less than an allowed time;

a placing mechanism configured to place a repeating flip-flop station within an embedded channel within the functional block on the integrated circuit, wherein the repeating flip-flop station is placed in a position that allows the transit time on the first section and the second section to be met and wherein routing the first section and the second section through the repeating flip-flop station allows signal timing requirements to be met without changing circuitry within a functional block of the plurality of functional blocks; and a routing mechanism configured to route the first section from the first functional block to an input of a flip-flop located at the repeating flip-flop station;

wherein the routing mechanism is further configured to route the second section from an output of the flip-flop to the second functional block.

14. The apparatus of claim 13, wherein the repeating flip-flop station includes a plurality of flip-flops.

15. The apparatus of claim 14, wherein the placing mechanism further configured to place the repeating flip-flop station at a location where flip-flops within the repeating flip-flop station can provide timing correction for multiple signals.

16. The apparatus of claim 13, further comprising a third functional block within the plurality of functional blocks, wherein the third functional block includes an embedded channel.

17. The apparatus of claim 16, wherein the repeating flip-flop station is overlaid on the embedded channel.

18. The apparatus of claim 13, wherein the placing mechanism is further configured to place multiple repeating flip-flop stations within channels on the integrated circuit thereby providing an ability to divide the interconnection into more than two segments to meet timing requirements.

* * * * *